United States Patent [19]
Sprenger et al.

[11] Patent Number: 5,861,882
[45] Date of Patent: Jan. 19, 1999

[54] INTEGRATED TEST AND MEASUREMENT MEANS EMPLOYING A GRAPHICAL USER INTERFACE

[75] Inventors: Michael Kent Sprenger, Mesa; Glen Eugene Sater, Phoenix, both of Ariz.

[73] Assignee: Motorola, Inc., Schaumburg, Ill.

[21] Appl. No.: 825,837

[22] Filed: Apr. 4, 1997

Related U.S. Application Data

[63] Continuation of Ser. No. 333,907, Nov. 3, 1994, abandoned.

[51] Int. Cl.$^6$ ...................................................... G06F 11/32
[52] U.S. Cl. ........................... 345/326; 364/188; 345/970
[58] Field of Search ..................................... 345/326, 348, 345/349, 339, 965, 967, 969, 970; 395/200.54; 364/221.4, 221.7, 238.2, 267.5, 221.2, 221.9, 237.2, 578, 188, 488

[56] References Cited

U.S. PATENT DOCUMENTS

| | | | |
|---|---|---|---|
| 4,744,084 | 5/1988 | Beck et al. | 395/183.09 |
| 4,812,996 | 3/1989 | Stubbs | 702/123 |
| 4,849,880 | 7/1989 | Bhaskar et al. | 395/703 |
| 4,901,221 | 2/1990 | Kodosky et al. | 345/348 |
| 4,914,568 | 4/1990 | Kodosky et al. | 345/349 |
| 5,136,705 | 8/1992 | Stubbs et al. | 395/183.03 |
| 5,155,836 | 10/1992 | Jordan et al. | 395/500 |
| 5,168,441 | 12/1992 | Onarheim et al. | 364/146 |
| 5,251,159 | 10/1993 | Rowson | 364/578 |
| 5,295,244 | 3/1994 | Dev et al. | 345/357 |
| 5,309,556 | 5/1994 | Sismilich | 345/349 |
| 5,392,207 | 2/1995 | Wilson et al. | 364/167.1 |
| 5,479,643 | 12/1995 | Bhaksar et al. | 395/500 |
| 5,566,088 | 10/1996 | Herscher et al. | 702/123 |

OTHER PUBLICATIONS

A publication entitled "LabVIEW® for Windows—Demonstration Guide", National Instruments, Austin, Texas, Nov. 1992 Edition, Part No. 350100–01, pp. iii–iv, Modules 1–10.

Primary Examiner—Matthew M. Kim
Assistant Examiner—Crescelle N. dela Torre
Attorney, Agent, or Firm—Frank J. Bogacz

[57] ABSTRACT

Multiple testing elements (26) are coupled to a bus (25) operated under the control of a graphically programmed computer (12). The computer (12) interrogates the bus (25) to identify the testing elements (26) coupled thereto. Icons (44) representing the testing elements (26) are displayed in an "Equipment Shelf" window (40). The user drags icons (44') from this window (40) onto a "Test Bench" window (42) and draws lines between I/O ports (4531 . . . 4431) on the icons (453 . . . 443) to graphically create a test circuit (54). The computer (12) generates bus commands to activate switches (28) to couple the testing elements (26) in the same manner as the graphical test circuit (54). Graphically set test ranges and parameters (472–494) are automatically sent to the testing elements (26) and test results (470) presented on the same computer display (16). The system (10) may be dynamically reconfigured for different tests without hand rewiring or loading of other test programs.

28 Claims, 9 Drawing Sheets

INTEGRATED TEST AND MEASUREMENT MEANS EMPLOYING A GRAPHICAL USER INTERFACE

This application is a continuation of application Ser. No. 08/333,907, filed Nov. 3, 1994 now abandoned.

Patent application Ser. No. 08/258645 to Herscher et al entitled "Modular Radio Test System and Method" filed Jun. 13, 1994 and assigned to the same assignee, is related.

FIELD OF THE INVENTION

This present invention relates to an improved means and method for testing a wide range of modern radios, radio systems, and other apparatus, and more particularly, a means and method wherein the test system configuration and operation can be defined by means of a graphical user interface.

FIELD OF THE INVENTION

For convenience of expression, the abbreviation "DUT" standing for "device under test" is used to refer to a radio or radio system or subsystem or other equipment or components or sub-assemblies thereof intended to be tested. The words "test system", "test set", "radio test system" and "radio test set" are used interchangeably to refer to a means for testing radios or radio systems or sub-systems or components or combinations thereof or other types of electronic apparatus. Testing may be for purposes of manufacturing evaluation, quality control, repair, calibration, alignment, adjustment, performance evaluation, diagnostics or other test purposes well known in the art. Radio test sets are the utilized in radio servicing and are also commonly referred to as "service monitors" and/or "communications systems analyzers".

With the advent of progressively more complex radio systems there has been a rapid divergence away from the simple amplitude modulation (AM) and frequency modulation (FM) technologies which were the standard modulation techniques in prior radio systems. More advanced radio systems make extensive use of digital processing to improve their spectral efficiency and to decrease the cost of the radio service provided to the user of the radio. The inclusion of digital signal processing permits use of more spectrally efficient modulation technologies such as, Time Division Multiple Access (TDMA), Code Division Multiple Access (CDMA), Quadrature Phase Shift Keying (QPSK), Quadrature Amplitude Modulation (QAM) techniques and other techniques known in the art. These and other present day modulation techniques are fundamentally digital in nature, transmitting information as a digital bit stream, which is received and decoded as digital words by the radio receiver. As a consequence of this technological evolution, radio test systems must have increasing capability and flexibility, especially the ability to handle many different modulation and signal coding techniques over a wide range of frequencies and signal levels.

Modern day radio test systems may need to use a wide variety of specific test instruments, as for example but not limited to, signal generators, modulators, demodulators, input-output (I/O) devices, amplifiers, mixers, coders and decoders (CODECS), oscilloscopes, distortion meters, power meters, multimeters, modulators, attenuators, filters, amplifiers, detectors, spectrum analyzers, synthesizers, display devices, measuring devices, and so forth. As used herein, the words "test element", singular or plural, are intended to refer to one or more of such devices or other types of passive or active instruments or devices or collections thereof needed to evaluate, test, calibrate or repair communication equipment, especially radios and other types of electronic apparatus.

Prior art test systems often use a comparatively fixed configuration of test elements which have been hard-wired together to test a predetermined DUT in a specified manner. The hard-wiring is often done by removable cables and plugs rather than soldering or other fixed connections so that the test combination may be more easily altered. In either case, when it is desired to test a different type of DUT, the various test elements must be disassembled and reconnected, usually by hand, in a new configuration suitable for the new DUT.

When a single test set must be able to handle multiple types of DUTs, all the required test elements must be included and the various test elements made to be selectable and settable by panel switches or plug boards or the like. As the number of different types of radio and radio systems or other DUTs increases, this classical, hard-wired, approach to creating suitable test sets is no longer practical. Test sets made in this way are burdened by the requirement of having within the test set, the capability to test all the envisioned radios or other DUTs even though much of the DUT specific hardware may stand idle much of the time. Such test sets are undesirably complex and expensive to build and operate, and/or are time consuming to reconfigure for different types of DUTs. Accordingly, there continues to be a need for an improved test system and method capable of accommodating a wide variety of radios and radio systems and other DUTs in a convenient and economic manner, and which may be easily and quickly reconfigured for different types of DUTs with minimal physical alteration of the system.

Some prior art test sets have included computers for controlling their operation. That is, once the test elements have been, for example, hand-wired into the desired configuration, then the computer provides the desired sequence of signals to exercise the DUT. However, programming of the functions controlled by the on-board computer has generally required the use of special, cryptic, test function languages which are tedious to use. This process is complex and time consuming and less flexible than is desired. Thus, there continues to be a need for improved means and methods for providing test systems, particularly test systems for radios and radio systems, which are entirely software programmable, that is, test systems that may be reconfigured without need to disassemble, rearrange and reconnect the test elements into a new test configuration by hard wiring or the like.

DETAILED DESCRIPTION OF THE PREFERRED EMBODIMENTS

Figure 1:
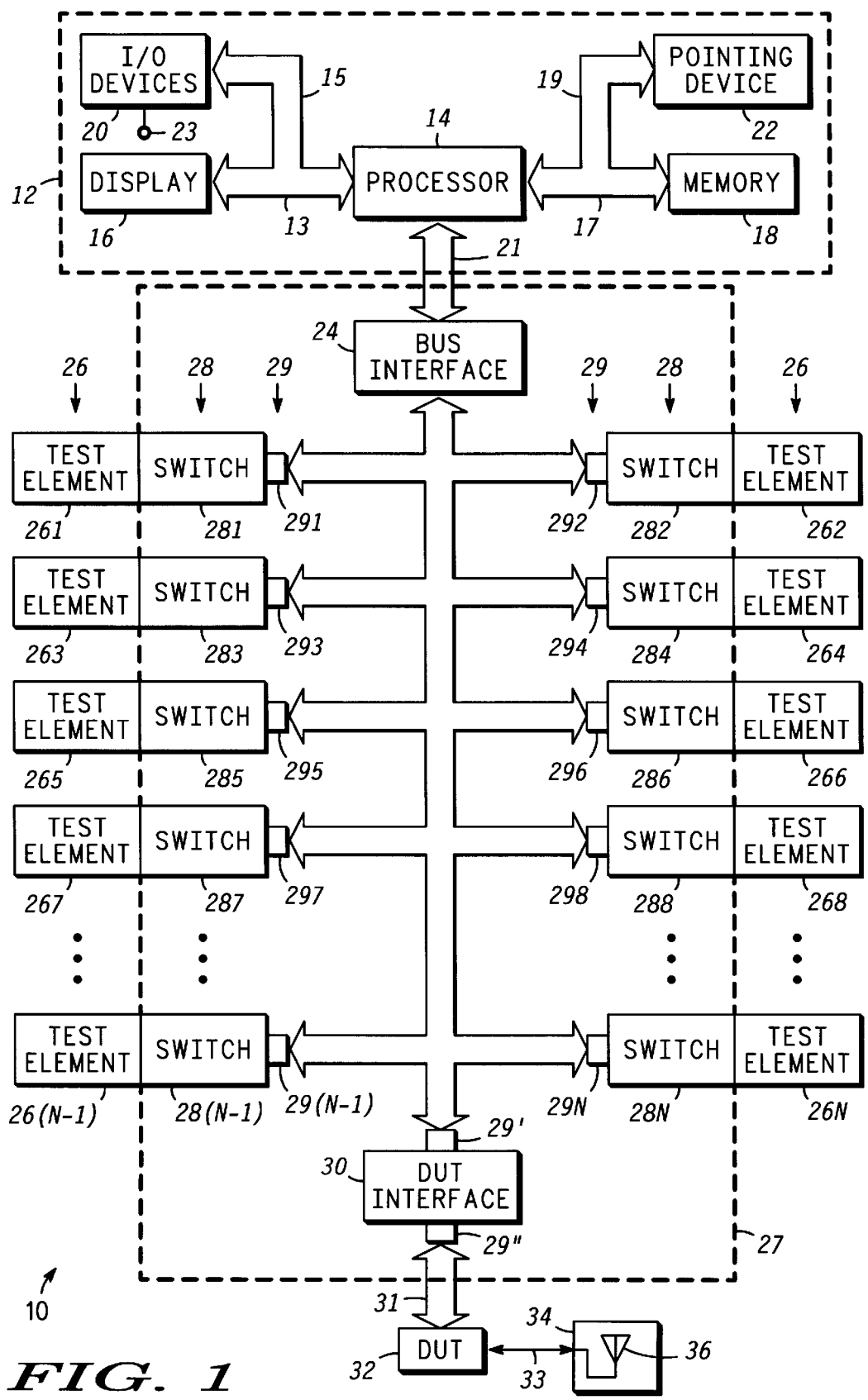
FIG. 1 shows a simplified, overview block diagram of a test set comprising multiple test elements, according to the present invention.

FIG. 1 is a simplified block diagram of computer controlled test system or test set 10 according to the present invention. Test set 10 comprises computer 12, as for example, any one of a number of present day personal computers (PC) or computer controlled workstations. PCs manufactured by IBM, Apple Computer, Compact Computer, SUN Microsystems, Inc., Silicon Graphics and Hewlett-Packard and others, having software which provides a graphical user interface are suitable. Examples of suitable graphical user interfaces (GUI) are the Apple Computer Macintosh™ operating systems for use on Apple Computers, and the Windows™ operating environment provided by the Microsoft Corporation for use on IBM PCs or IBM PC clones. Such graphical user interfaces and operating systems are well known in the art. Microsoft Visual C++™ is an example of a programming language useful for writing GUI application programs.

Computer 12 comprises processor 14, as for an example, the x86 and Pentium family of processors manufactured by Intel Corporation for use in the IBM PC and PC clones or the 68xxx and Power PC families of processors manufactured by Motorola, Inc. for use in Apple computers and other computers. Processor 14 is coupled by busses 13, 15 to display 16 and I/O devices 20. I/O devices 20 may conveniently include a keyboard, a pen, and other well known types of external ports or interfaces 23 such as, for example but not limited to, serial ports, parallel ports, IEEE 488 ports, etc. Such I/O devices and ports are well known in the art. Display 16 may be a CRT or liquid crystal display such as are commonly used with computer 12.

Processor 14 is coupled by bus 17 to memory 18 and by bus 19 to pointing device 22. Memory 18 may include RAM, ROM and EPROM devices, and archival storage devices such as floppy disks, hard disks, CD ROMs, tape storage devices and other types of memory known in the art. Pointing device 22 is conveniently a "mouse" or "track-ball" but any convenient pointing device may be used. While computer 12 has been described as being a conventional PC or work station, any computer of equivalent or greater capability may be used. Portable or "notebook" or similar small and easily carried computers are particularly convenient because they may be easily moved from location to location and when combined with the other apparatus illustrated in FIG. 10, provide a system of compact overall dimensions.

Processor 14 is coupled by bus 21 to bus interface 24. Bus interface 24 provides a signal and connection transition between bus or interconnection means 25 which couples to test elements 26 via switches 28 and optional connection-disconnection plugs 29. Test elements 26 comprise multiple individual test elements 261, 262, . . . 26N. Switches 28 comprise multiple individual (e.g., multi-lead) switches 281, 282, . . . 28N. Plugs 29 comprise multiple individual (e.g., multi-lead) plugs 291, 292, . . . 29N. Bus 25 is a multi-leaded bus, preferably comprising analog signal lines, digital signal lines, RF signal lines, power, ground, and various control lines. Signals supplied to the various leads on bus 25 cause switches 281 . . . 28N to open or close thereby connecting test elements 261 . . . 26N to each other and to DUT interface 30 and DUT 32 via bus 25. In general, switches 28 and plugs 29 are multi-lead devices. The number and types of leads in any given switch preferably depends upon the function of the individual test element 26 to which the switch is coupled. A given switch may contain switching devices for connecting and disconnecting any of the types of signals which may flow along bus 25. Thus, switches 28 may, in some cases, include RF switches as well as switches for signals which are digital, analog, power and/or ground or combinations thereof. Optical switches may also be included where a particular test element employs optical signaling. Similarly, plugs 29 provide connections for whatever types of signals need to be coupled to test elements 26 and switches 28.

Plugs 29 may contain more leads than are utilized by an individual one of switches 28 and test elements 26 since, not every type of signal needs to be coupled to or from every type of test element. It is desirable but not essential that plugs 29 contain all of the signal leads desired for operation of test system 10 since this permits any of test elements 26 and accompanying switches 28 to be plugged into any of plugs 29. However, in order to reduce complexity, some of plugs 29 may omit leads which are needed only by a small percentage of test elements. For example, a first subset of plugs 29 may include RF connections while a second subset does not. The corresponding test elements would then be limited to insertion into those of plugs 29 that included the leads required for their operation.

Switches 28, plugs 29 and bus 25 desirably contain sufficient leads so that any of test elements 26 may be connected to any other of test elements 26 either directly or in serial connection with other test elements. Shielding is conveniently provided within bus 25 so as to minimized cross talk between lines carrying different types of signals. Switches 28 are electronically controlled, that is, each of switches 281 . . . 28N may be opened or closed based upon signals sent along control lines in bus 25 with appropriate addresses so as to activate the switches associated with the desired test elements.

It is desirable that individual test elements 261 . . . 26N and their corresponding switches 281 . . . 28N be able to connected and disconnected from bus 25 as a unit (e.g., using corresponding plugs 291 . . . 29N), but this is not essential. In this way, the switch associated with a particular type of test element may be specific to that type and need not contain switch elements not required by such test element. For example, a passive RF filter or attenuator, need only have RF switches and no DC or low frequency AC or digital signal or power switches or connections in the plug associated therewith. Similarly, an audio signal generator or loud speaker or microphone need not have any RF switches or connections associated therewith.

While FIG. 1 shows a preferred embodiment wherein there is a separate one of switches 28 associated with each of test elements 26, this is not essential and some switching functions may be combined within interfaces 24, 30 depending upon the capabilities desired for test set 10.

While electrical and optical lines 25 have been, for convenience of explanation been identified as a "bus", this is not intended to be limiting and those of skill in the art will understand based on the description herein that switches 28, plugs, 29, interfaces 24, 30 and interconnection means 25 contained within dashed outline 27 form an electronic (and optical) switching matrix or network whose function is to allow, in its broadest form, any of test elements 26 to be coupled to any others of test elements 26 and to DUT 32, as directed by and under control of computer 12, and in a manner consistent with the types of signals being provided, processed or measured by the various test elements and the DUT. Those of skill in the art will understand based on the description herein that any computer controlled switching network or matrix that provides the above-described function may be used. As used herein, the word "bus" is intended to include any such switching matrix or network. Examples of other suitable computer controlled networks are star, loop and matrix configurations, and combinations thereof.

Interface 30 is provided to couple DUT 32 to bus 25 and via bus 25 and switches 28 to test elements 26. Plugs 29', 29" similar to plugs 29 are conveniently included to allow interface 30 to be connected or disconnected from bus 25 and from bus 31 leading to DUT 32. Like bus 25, bus 31 is capable of carrying multiple types of signals and control instructions. Alternatively, plug 29" may be placed at the end of bus 31 where it couples to DUT 32 or a disconnectable plug maybe provided at each end of bus 31. Where DUT 32 requires additional connections not available via bus 25 and bus 31, other signal leads 33 are provided to couple DUT 32 to external element 34, as for example and not intended to be limiting, antenna 36.

While FIG. 1 illustrates a situation where the connections to DUT 32 are primarily by wires or cables, test set 10 is not limited to this manner of coupling energy and/or information to DUT 32. For example, one or more of test elements 26 may comprise a reference transmitter, receiver, and/or transceiver which include one or more antennas capable of passing signals through the air to and/or from, for example, antenna 36 coupled to DUT 32. In this manner, where DUT 32 is a radio, its ability to transmit and/or receive over-the-air signals can be properly evaluated. Because test set 10 is modular and can include any desired test elements 26 coupled to bus 25, such improved functionality is more conveniently provided. The reference transmitter, receiver and/or transceiver and DUT 32 can be operated via bus 25 under the control of computer 12.

Computer 12 is most conveniently a computer using a stored operating system and applications programs which provide a graphical user interface (GUI). When computer 12, bus interface 24 and bus 25 are energized, processor 14 conveniently polls or interrogates bus 25 via bus interface 24 to determine the identity and address of test elements 261–26N which are coupled to bus 25 via switches 28 and optional plugs 29. Each test element 261–26N desirably has associated with it a unique address. Such address may be determined, for example, by the address of the physical port (e.g., plug 291 . . . 29N) to bus 25 where test elements 26 and associated switches 28 have been inserted. Individual ones of test elements 26 and associated switches 28 may be of any type required to operate and measure the performance of a radio, radio system, or subsystems or components thereof.

It is convenient to provide each test element with a unique identification which can automatically be recognized by processor 14 via busses 21, 25, and bus interface 24. In this manner, computer 12 can determine, for example, that test elements 261 is an oscilloscope having certain properties, test element 262 is a DC multi-meter, test element 263 is a hi-pass filter with a certain corner frequency (which may be adjustable), element 264 is a low-pass filter with a certain corner frequency (which may be adjustable), element 265 is an audio signal generator, element 266 is an RF signal generator, test element 267 is a modulator, and so forth.

In a preferred embodiment, the unique identification (ID) associated with each test element identifies a corresponding set of test element properties stored in memory 18, or stored within the individual test elements or a combination thereof. For example in a first implementation, memory 18 contains a complete set of parameters describing the operating capability of oscilloscope 261. Similarly, there is stored in memory 18 or elsewhere a corresponding set of measurement instrument parameters, available ranges, types of signals required, numbers of inputs and outputs, and so forth peculiar to each connected test element. Such data is retrievable based on the ID obtained during the polling operation.

While the foregoing is a convenient and preferred method of providing computer 12 with data concerning each test element 26 and switch 28 which is coupled to bus 25, other well known means may also be used. For example, test element 26 or switch 28 may include a read only memory (ROM) which is interrogated by bus 25 and which responds with the data associated with the interrogated test element and switch, which data is then stored in memory 18. In this manner, the data associated with an individual test element is carried by the test element itself and only loaded into computer 12 when such test element and corresponding switch are inserted into bus 25 using one of plugs 29. This approach has the advantage that it ensures that the test element data resident in memory 18 is always current and corresponds exactly to the test elements which have been coupled to bus 25. Alternatively, a larger library of all possible test elements types is stored or loaded in memory 18 and the data corresponding to those coupled to bus 25 retrieved by means of the ID's obtained during polling of the test elements coupled to the bus. A combination thereof may also be used.

As used herein, the word "window" is intended to refer to a region of the GUI on display 16 in which certain icons can be placed and interconnected and adjusted. Icons are, in general, graphical symbols which may be activated by a GUI pointing device to perform certain functions. The use of icons in windows on computer displays to represent devices or call programs is well known. With respect to the present invention, the word "icon" refers to a graphical symbol representing, for example, a test element or other real physical device or feature of a real physical device.

Figure 2:
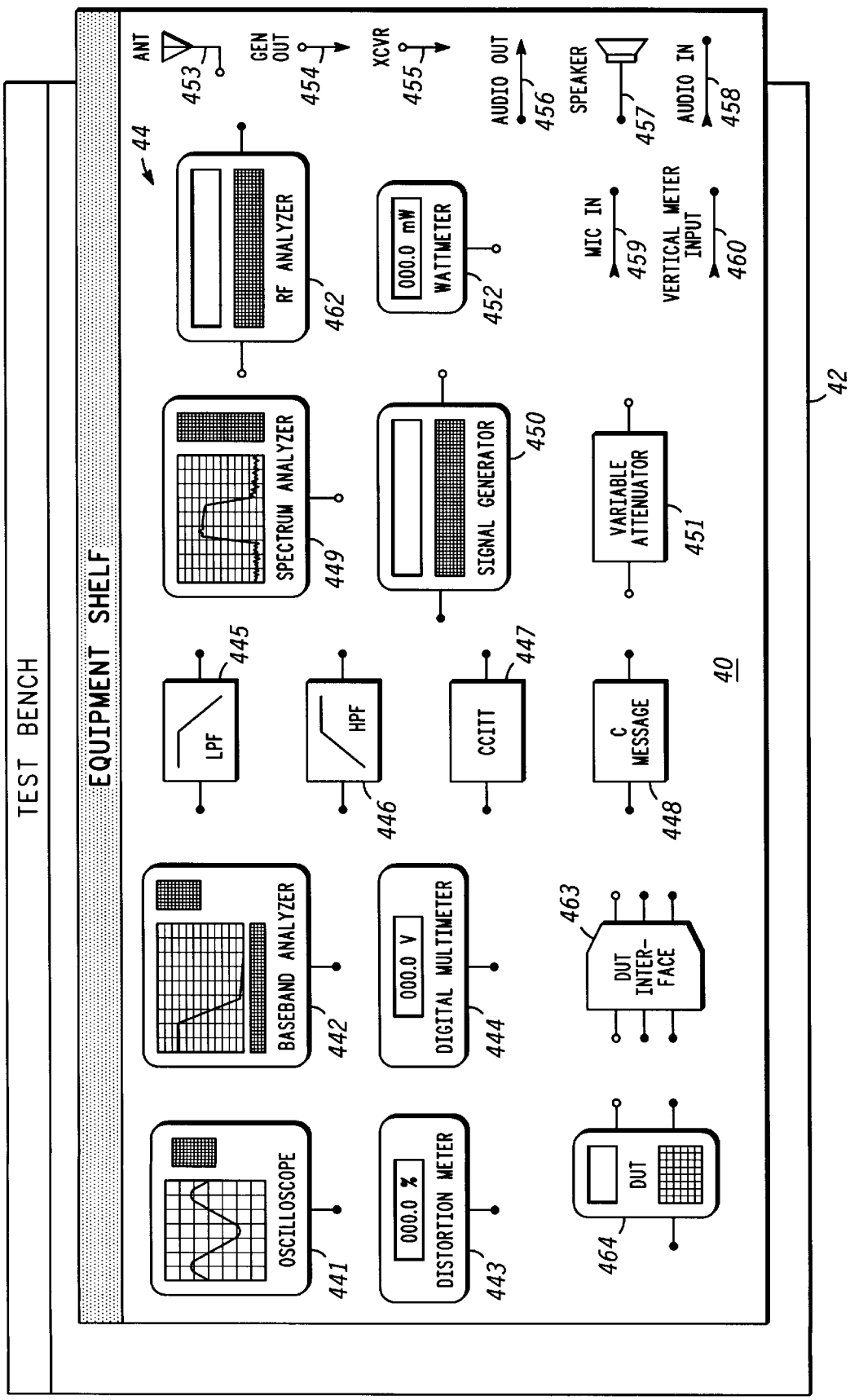
FIG. 2 is a simplified representation of a graphical display referred to as the "Equipment Shelf" viewed by the user of the present invention which shows icons representing the test elements available for use.

FIG. 2 shows a graphical presentation as is observed on display 16 of computer 12, according to the preferred embodiment of the present invention. Display 16 exhibits "Equipment Shelf" window 40 in which are presented various icons 441–464 (collectively icons 44). Icons 441–462 represent in graphical form various test elements 26 available on bus 25 to be interconnected by switches 28. Icon 463 represents DUT interface 30 and icon 464 represents DUT 32. Window 40 may be the only active window or may be superimposed on another window, as for example, "Test Bench" window 42 as shown in FIG. 2.

Equipment Shelf window 40 shows various icons 44, as for example, oscilloscope 441, baseband analyzer 442, distortion meter 443, digital multi-meter 444, low pass filter 445, high pass filter 446, CCITT response weighting audio filter 447, C-MESSAGE response weighting audio filter 448, spectrum analyzer 449, signal generator 450, variable attenuator 451, wattmeter 452, RF analyzer 462, as well as various auxiliary elements such as, for example, antenna 453, generator output 454, receiver connection 455, audio output 456, output for speaker 457, external audio input connection 458, microphone input connection 459, other input 460 and so forth. DUT interface 463 (corresponding to DUT interface 30 in FIG. 1) and DUT 464 (corresponding to DUT 32 in FIG. 1) are also shown.

Figure 3:
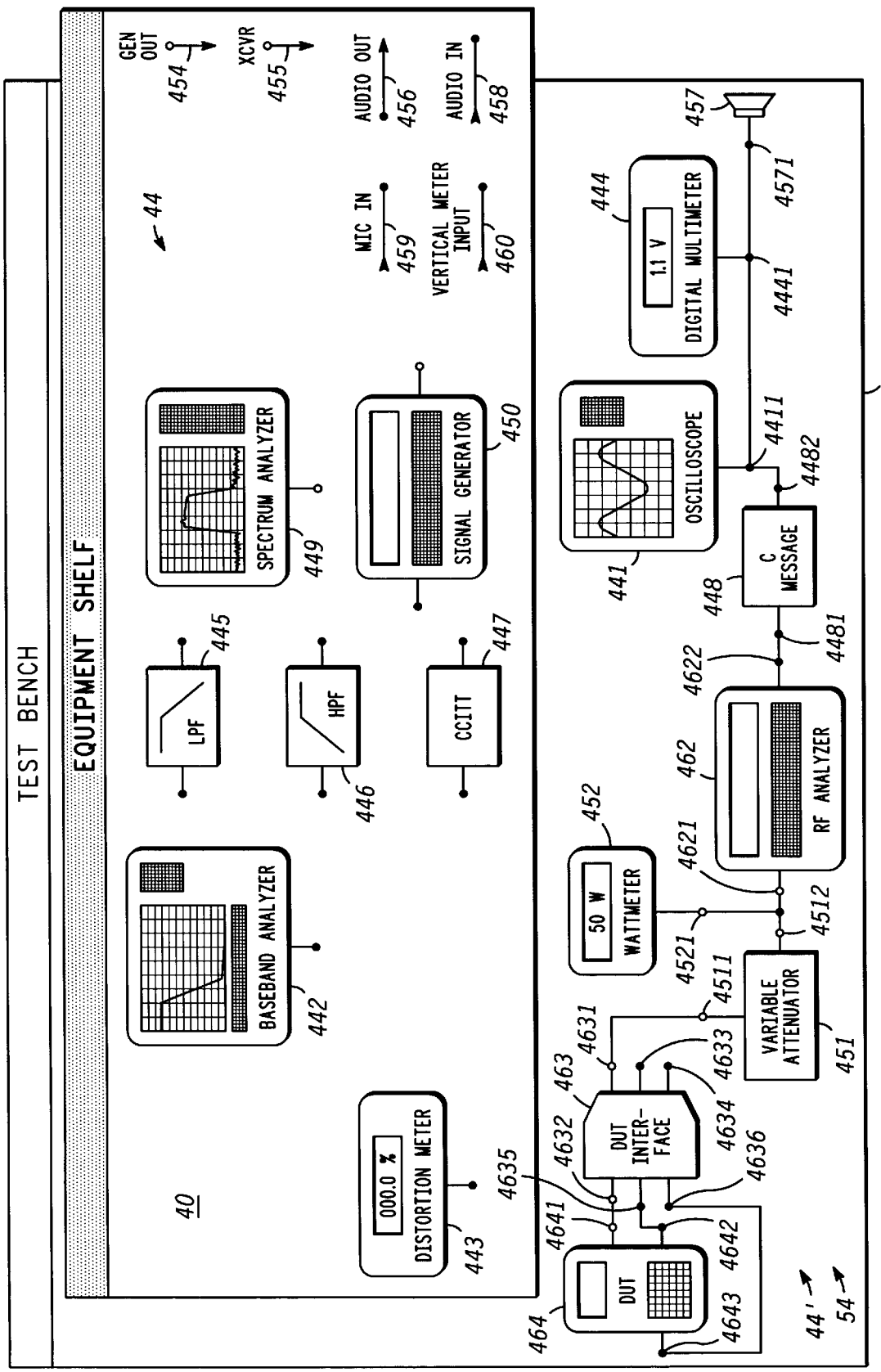
FIG. 3 is a display similar to that in FIG. 2 wherein certain of the available test element icons have been moved onto a further portion of the graphical display referred to as the "Test Bench" and interconnected in order to perform a test.
Figure 4:
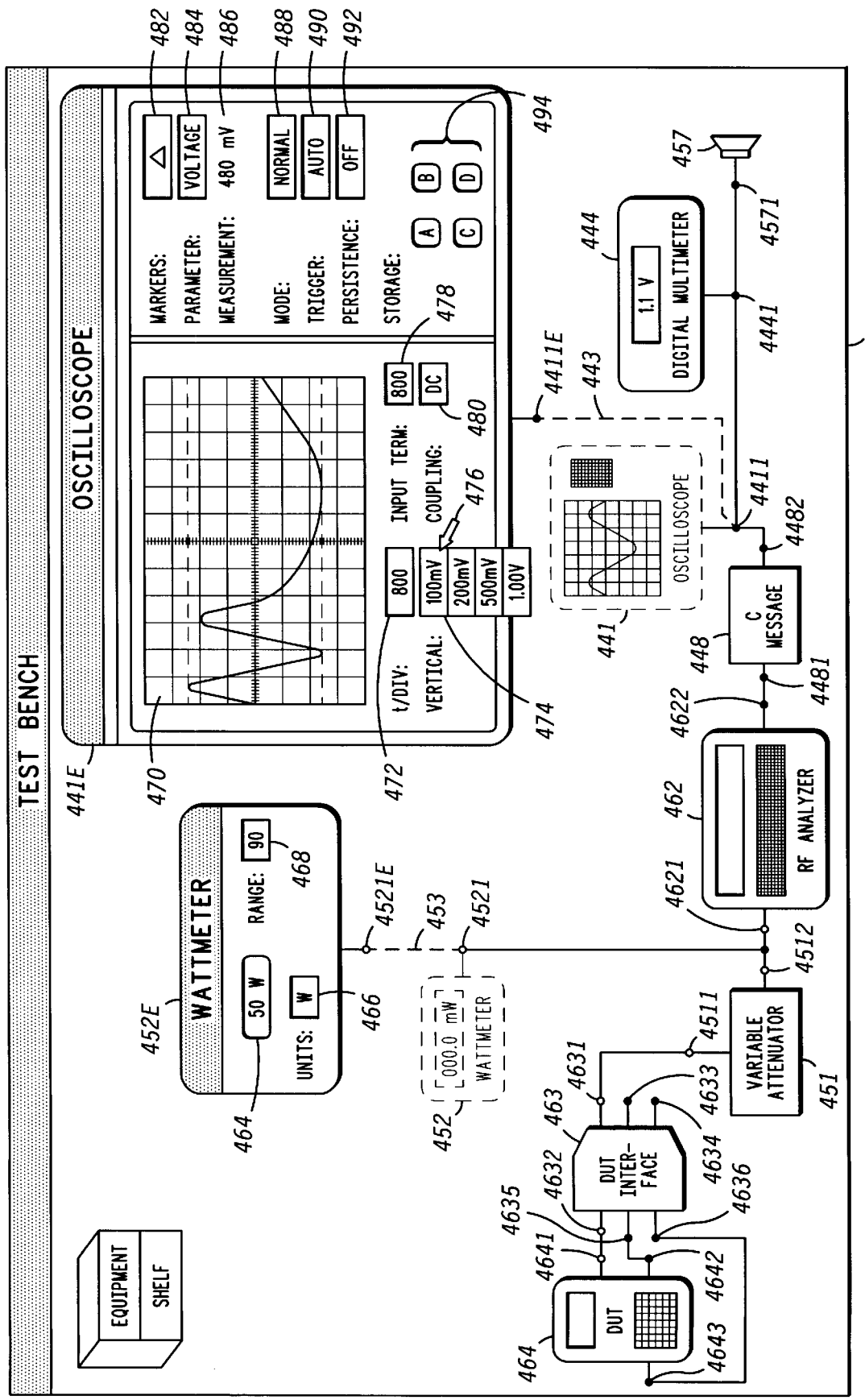
FIG. 4 is a display similar to FIG. 3, illustrating how measurement results are presented by enlargement of certain test element icons so that the output may be observed and various controls associated with the selected test element icons manipulated by graphical means.

There is a one-to-one correspondence between icons 44 in FIGS. 2–4 and test elements 26, DUT interface 30 and DUT 32 in FIG. 1. Associated with each icon 44 are graphical input-output (I/O) symbols corresponding to the actual I/O ports of the element which the icon represents. Thus, some icons have only a single I/O port symbol whereas other icons may have 2, 3, or more I/O port symbols according to their function. For convenience of use, the I/O port symbols of the various elements may have different geometric shapes, coloring or shading so that different types of signal lines may be readily identified. For example, in FIGS. 2–4, RF ports are shown as open (unfilled) circles and other types of ports are shown as closed (filled) circles. Digital ports may have a different shape that analog ports, as for example, squares rather than circles, and so forth.

Associated with each icon is an underlying test element data file stored (e.g., in memory 18) which contains the bus address for the test element corresponding to the particular icon, and other data about the test element which describe the test functions which the test element is capable of providing and the ranges over which it may operate. As will be subsequently explained, by selecting and enlarging a particular icon, further details concerning the associated test element may also be viewed on the screen and certain adjustable parameters associated with an individual test element may be set be means of further graphical symbols associated with the enlarged form of the icon.

While Equipment Shelf window 40 is illustrated in FIG. 2 as containing only one exemplar of each individual type of test element, those of skill in the art will understand that multiple test elements of the same type may be provided by simply plugging duplicates into empty sockets 29 on bus 25. By having a unique address associated with each bus socket on bus 25, multiple test elements even of the same type, may be specifically distinguished.

FIG. 3 shows a graphical user interface similar to that depicted in FIG. 2 in which a sub-set 44' of icons 44 from Equipment Shelf window 40 have been moved onto a second window or portion of the display screen identified as "Test Bench" 42 and interconnected to form a graphical description of desired test circuit 54.

The particular test arrangement shown on Test Bench 42 is merely for purposes of example and explanation and is not intended to be limiting. In operation, a user selects from icons 44 depicted in Equipment Shelf window 40 those that are desired to be moved onto Test Bench 42. In the example shown, DUT 464, DUT interface 463, variable attenuator 451, wattmeter 452, RF analyzer 462, C-MESSAGE response weighting audio filter 448, oscilloscope 441, digital multi-meter 444, and speaker 457, have been relocated from Equipment Shelf window 40 to Test Bench window 42 to form sub-set 44'. The I/O ports of the various sub-set of elements 44' have been interconnected to form circuit 54. Sub-set 44' may include a portion or all of the icons 44 on Equipment Shelf window 40.

Interconnection of the I/O ports is conveniently accomplished by a drag and drop procedure which is explained in more detail later and which persons of skill in the art will understand how to accomplish in a GUI, for example, of the types supported by the Windows™ environment, based on the description herein. It well known in the Windows graphical environment, for example, to reposition icons to various portions of an open window and to move them from one window to another by either employing a copy and paste routine or a drag and drop procedure. The results are substantially the same. Once sub-set 44' of icons 44 have been selected and moved from graphical Equipment Shelf window 40 to graphical Test Bench window 42, they may be connected graphically and physically. In FIGS. 3–4, the icon I/O ports are identified by adding a fourth digit to the reference number for the icon. For example, the I/O ports of attenuator 451 are identified as 4511 and 4512, and so forth.

In order to couple icons 44' to form desired test circuit 54, a graphical interconnection tool is provided, coupled to pointing device 22. Graphical interconnection tools and software required to provide such are well known in the art. The graphical interconnection tool permits the test set operator to use pointing device 22 to draw a line or lines coupling the desired I/O ports of the various icons. Such lines represent graphically the physical connections desired to be made between elements 26, 30 and 32 represented by icons 44'. For example in FIG. 3, a connection has been drawn between ports 4641–4643 of DUT icon 464 and port 4632, 4635 and 4636 of DUT interface icon 463. Port 4631 of DUT interface icon 463 is coupled to port 4511 of variable attenuator 451. In test circuit 54, ports 4633–4634 of DUT interface icon 463 are not connected. Port 4512 of attenuator 451 is connected to port 4521 of wattmeter 452 and to port 4621 of RF analyzer 462. Port 4622 of RF analyzer 462 is coupled to port 4481 of C-MESSAGE response weighting audio filter 448, which, in turn, has its port 4482 coupled to port 4411 of oscilloscope 441, port 4441 of digital multi-meter 444 and port 4571 of speaker 457.

When a connection is made graphically between I/O port symbols of icons 44' on Test Bench window 42, computer 12 then has available sufficient information to be able to couple the corresponding physical I/O ports of the corresponding physical test elements, DUT interface 30 and DUT 32. The act of graphically selecting the icons and connecting their I/O port symbols provides information so that computer 12 can create a net list of the physical ports to be connected on the physical test elements. Computer 12 retrieves from memory the bus control signals which set switches 28 to couple the corresponding I/O ports of the corresponding test elements 26, DUT interface 30 and DUT 32 together in the manner determined by the graphical connections in circuit 54 on Test Bench window 42.

FIG. 4 is a presentation similar to FIG. 3 of the GUI seen by the operator of the system in which icons 452 and 441 have been selected and enlarged (452E, 441E) to show their settings and the measurements being obtained. In FIG. 4, wattmeter 452 has been moved from Equipment Shelf window 40 to Test Bench 42 and inserted in test circuit 54 by coupling input port 4521 to port 4512. Dashed line 453 is provided leading from port 4521 to port 4521E of enlarged icon 452E of wattmeter icon 452, while original icon 452 is conveniently dimmed or shown in shadow form. Enlarged icon 452E shows various measurement 464 and measurement ranges and units 466–468 under which wattmeter 452 is operating. In similar fashion, enlarged icon 441E corresponding to a graphical representation of oscilloscope icon 441 is shown coupled by dashed line 443 between ports 4411 of icon 441 and port 4411E of enlarged icon 441E.

Enlarged oscilloscope icon 441E shows actual oscilloscope signal trace display 470 as well as various range scales, as for example, time base ("t/div") scale 472, vertical scale 474 (using a pull down menu) the value of which can be selected by manipulating graphical pointer 476 controlled by pointing device 22. Other adjustable and selectable parameters associated with oscilloscope icon 441E are also shown, as for example, markers 482, measurement parameter (e.g., "voltage") 484, signal peak-to-peak excursion 486 (e.g., 480 millivolts), mode 488, trigger mode 490, persistence mode 492, and storage selection options 494. These settable parameters, variables or options associated with the operation of the graphical oscilloscope icon 441 correspond to the parameters, variables or options available on the real oscilloscope (e.g., oscilloscope test element 261) which corresponds to oscilloscope icon 441. The display on FIG. 4 shows both the static data descriptive of the real oscilloscope represented by icon 441 as well as the dynamic measurement being made by the test element corresponding to oscilloscope icon 441. Thus, in the present invention there is a one-to-one correspondence between the icons in normal or enlarged mode and the particular test elements coupled to bus 25 which the icons represent.

Since enlarged icon 441E includes a display of the signal actually being received by the corresponding test element (e.g., elements 261), there is no need for a display in the physical oscilloscope test element. The signals that would otherwise be used to drive a CRT of a free standing oscilloscope are sent back along bus 25 to computer 12 and presented with the corresponding enlarged icon 441E. This same feature applies to other test elements which as free standing instruments might have their own separate displays, but which in the present invention send their output signals along bus 25 to computer 12 for presentation on display 16, preferably in connection with an enlarged form of the icon representing the test element. While this is the preferred arrangement, test elements 26 are not precluded from having independent output displays or indicators if that is desired.

Figure 5:
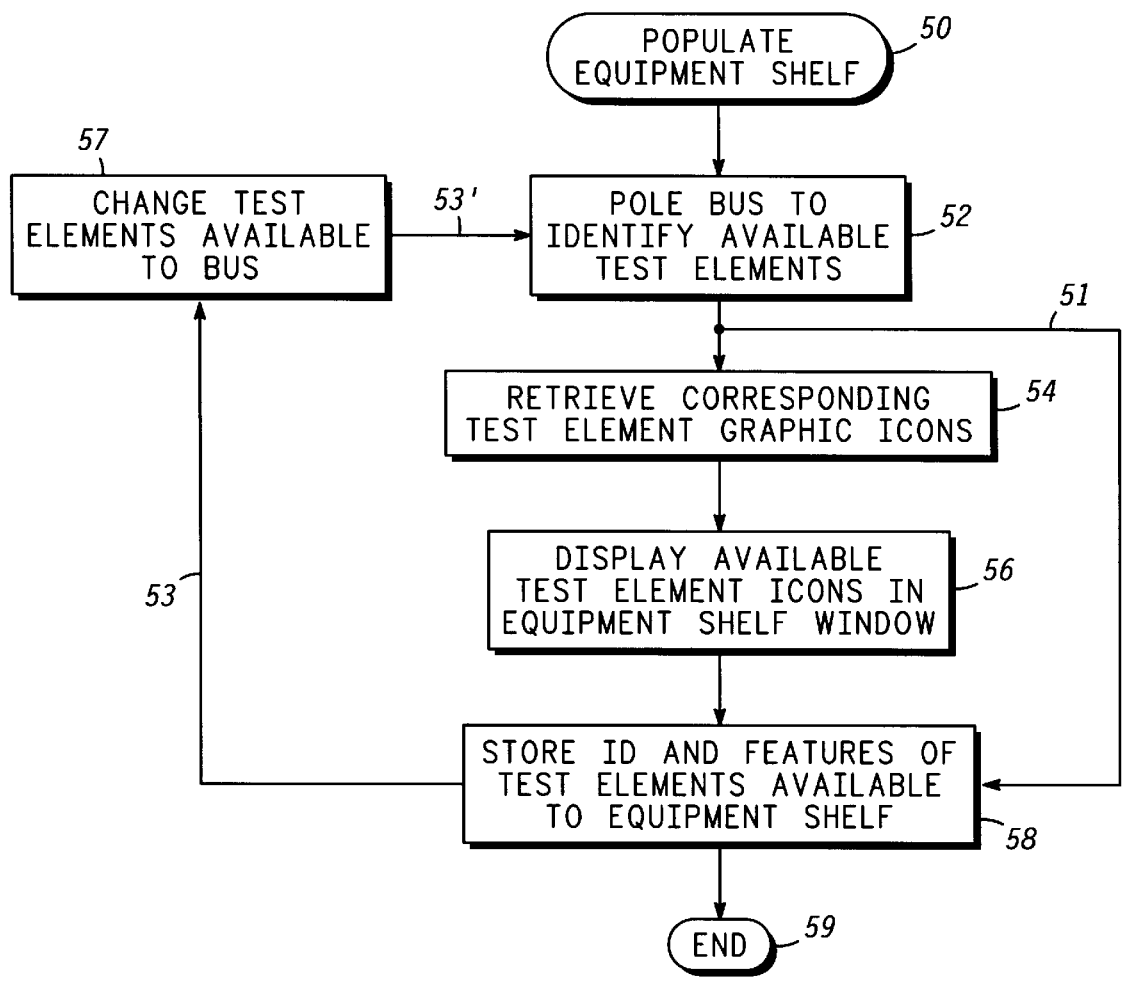
FIG. 5 is a flow chart illustrating further details of the operation of the apparatus of the present invention, in which the graphical Equipment Shelf is populated.

FIG. 5 shows in simplified form, a flow chart illustrating the operation of the present invention in greater detail, in particular, process 50 for populating Equipment Shelf window 40. As illustrated in FIG. 5, step 52 is performed to poll or interrogate bus 25 to identify available test elements 26 and corresponding switches 28, including DUT interface 30 and DUT 32 (if connected). In step 54, the corresponding test element graphic icons are retrieved either from memory 18 or by reading information stored within individual test elements 26 (or DUT interface 30) or a combination thereof. In step 56, the graphic icons associated with each of the test elements which are available to bus 25 are displayed in window 40 entitled, for example, "Equipment Shelf". While the label "Equipment Shelf" is preferred, any desired window title may be used. The same applies to the label "Test Bench".

In step 58, the ID, features and other data associated with test elements 26 available on bus 25 (and therefore to Equipment Shelf window 40) are stored in memory, preferably memory 18. As indicated by line 51, this may be done immediately after step 52 or at any time during the sequence 54, 56, 58. As indicated by lines 53, 53' and step 57, the user may at any time change the test elements available to bus 25 by unplugging one and replacing it with another or simply adding an additional test element to an otherwise empty plug socket. Computer 12 desirably repeats the polling and other steps 52–58 to identify the available test elements 26 and identify and/or store in memory the ID numbers and associated data for all the available test elements. When the desired test elements are present on Equipment Shelf window 40 and their associated data stored in memory, the procedure ends as indicated at 59.

Figure 6:
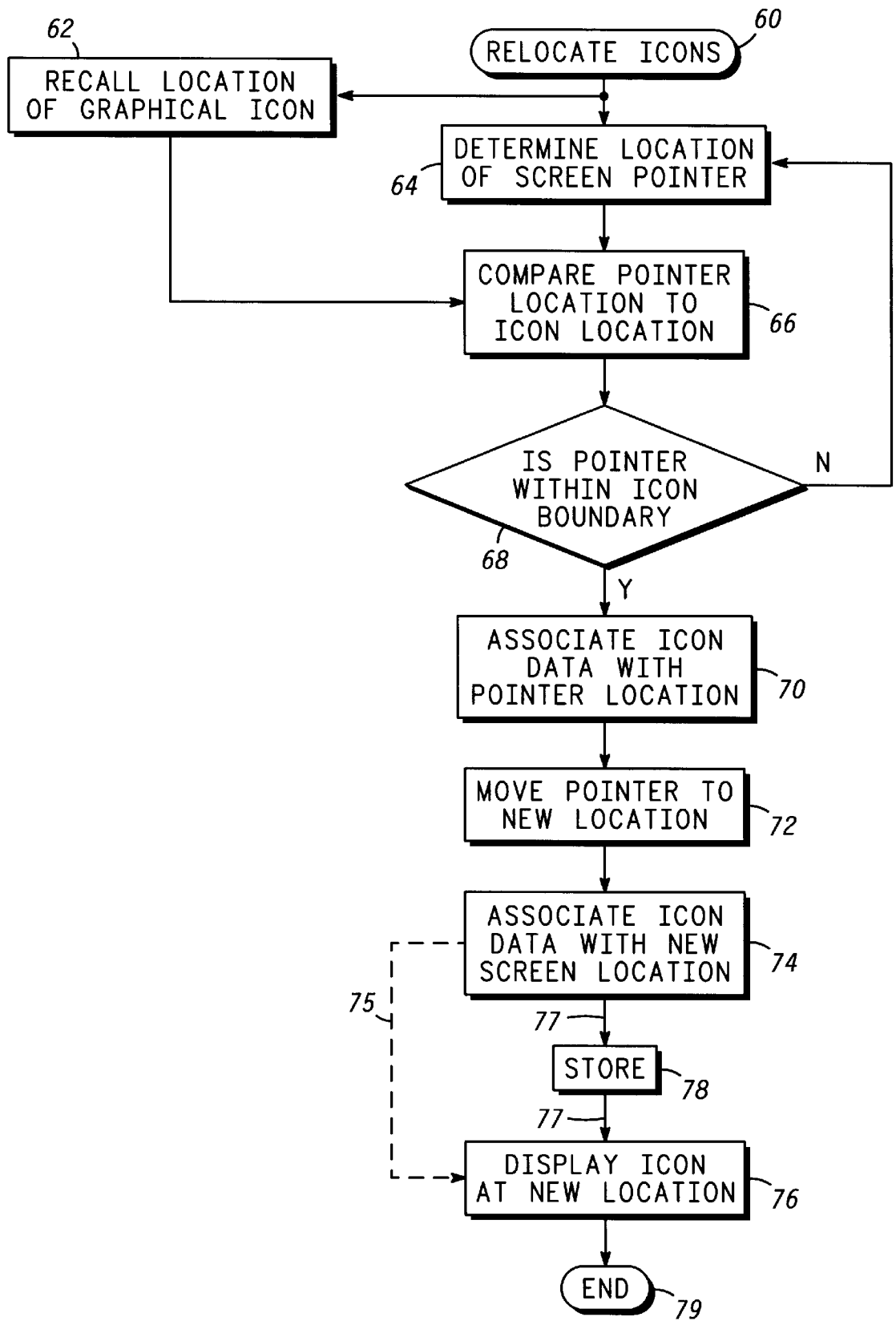
FIG. 6 is a simplified flow chart showing how graphical rearrangement of icons on the computer display may be accomplished and related to the underlying data associated with the icons.

FIG. 6 shows a simplified flow chart illustrating process 60 whereby various icons 44 may be moved within window 40 or moved from Equipment Shelf window 40 to Test Bench window 42 or otherwise selected or selected and relocated. In step 62, the screen location of a particular graphical icon is recalled or determined. In step 64 the location of graphical screen pointer 476 controlled by pointing device 22 is determined. Steps 62 and 64 may be performed in either order or in parallel as indicated in FIG. 6. In step 66, the location of the screen pointer and the perimeter of the graphical icon are compared and query step 68 undertaken to determine whether the pointer 476 is within the icon boundary. If pointer 476 is within the icon boundary, then the icon is "selected" and in step 70 the data related to that icon is associated with the pointer location. "Selecting" the icon has the effect of coupling it and its associated data with the pointer location. In step 72, the user moves the pointer to a new location. In step 74, the icon data is associated with a new screen location and in step 76, the icon is displayed at the new location, either directly, as shown by line 75, or via a "store" operation shown in step 78 as indicated by line 77. Once the icon and its associated data are identified with a new screen location, the procedure ends as indicated at 79. As those of skill in the art will appreciate, the screen location may be within the same window in which the icon was originally located or may be in a different window, the identity of the window in which the icon is located being, for example, part of the associated icon data.

Figure 7:
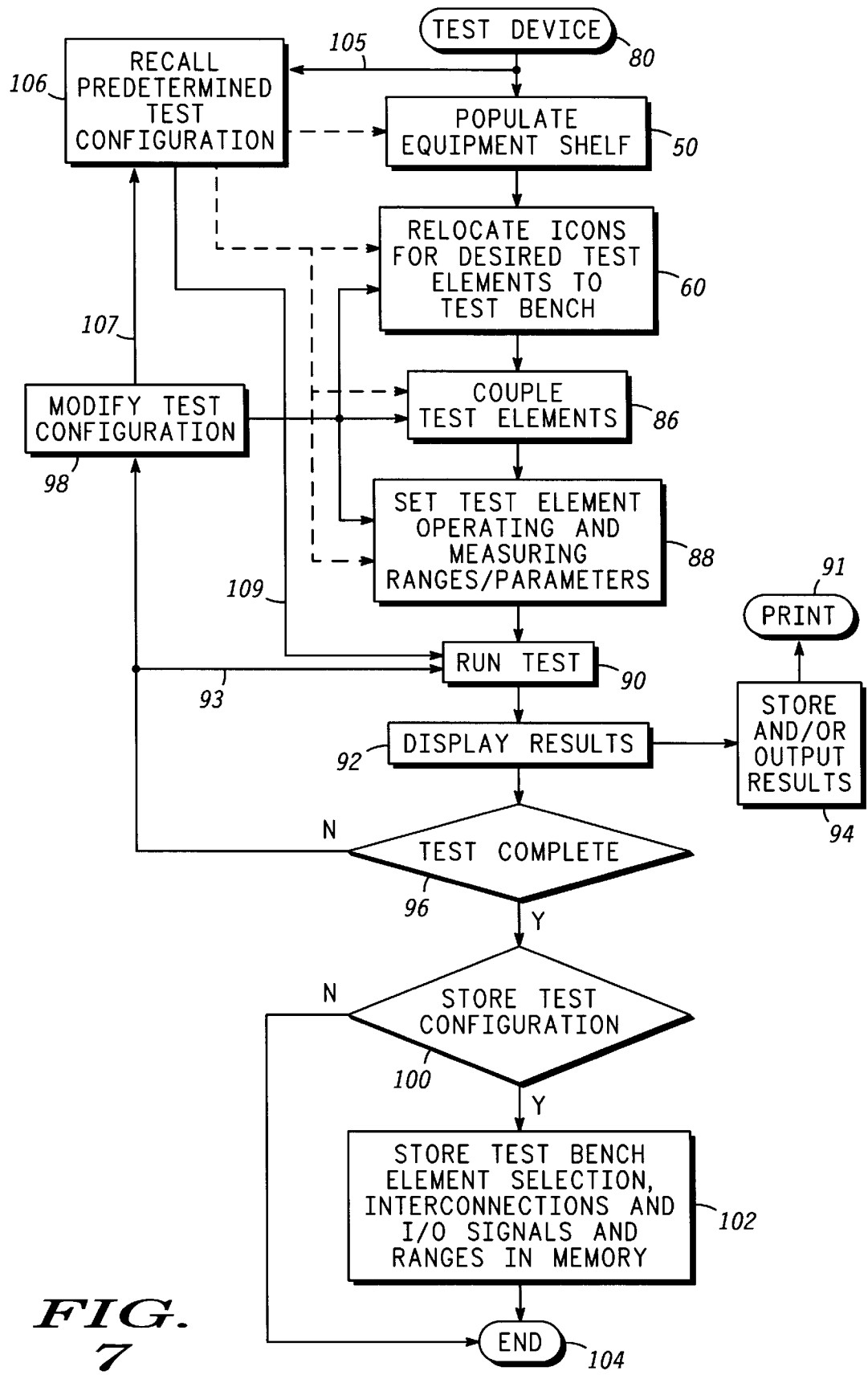
FIG. 7 is a simplified flow chart illustrating the method of operation of the test equipment according to the present invention.

FIG. 7 is a simplified flow chart illustrating the execution of routine 80 to test a device. In step 50, Equipment Shelf window 40 is populated with icons 44 representing the elements available to computer 12, as explained in connection with FIG. 5. In step 60, a sub-set 44' of icons 44 are relocated from Equipment Shelf window 40 to Test Bench window 42, as described in FIG. 6. The sub-set 44' (chosen by the user) comprises the particular icons needed to execute the desired test. In block 86, icons 44' are coupled together in the manner shown in FIG. 3 to form circuit 54. In step 88, the operating and measuring ranges and parameters are set for the various test elements, as illustrated in connection with FIG. 4. Circuit 54 and the parameter settings illustrated on FIGS. 3–4 are intended to be mere examples of the many circuits and instruments settings that can be provided and not to be limiting.

Once the desired test elements 44' have been coupled together in step 86 and the test set element operation and measuring ranges and parameters set in step 88, then the test is run in block 90. The results may be shown in step 92 on display 16 (e.g., see FIG. 4). The test measurement results may be stored in step 94 and/or output through I/O devices 20 to other devices, as for example, to a printer at 91.

After displaying the measurement results in step 92, query step 96 is desirably undertaken to determine whether the test is complete. If the answer is "No", then step 98 may be undertaken to modify the test configuration or operation in some fashion. The output of step 98 may feed to either block 60 if additional icons and are transferred to the Test Bench window so as to be available for coupling into the test circuit in step 86 or, alternatively, different parameter and operating ranges may be set in block 88 and the test repeated in test step 90.

Alternatively, as indicated by line 93, test set 10 can be programmed to run the same test repeatedly. This is especially valuable where the user needs to study various different outputs or different portions of the same output to evaluate the performance of the DUT.

A particular feature of the present invention is that the test configuration can be dynamically modified without having to terminate the test or shut off the test set. Suppose for example, that a test being run shows an unusual output which cannot be properly interpreted with the test elements already included in circuit 54, and that it is desired to include in test circuit 54 an additional test element, such as for example, baseband analyzer 442. The user activates Equipment Shelf window 40, selects baseband analyzer 442 and moves it onto Test Bench window 42. Analyzer 442 powers up automatically upon being relocated to Test Bench window 42. The user inserts analyzer 442 into circuit 54 by coupling input 4421 of analyzer 442 to the appropriate point in circuit 54, in the same manner as has been previously described. The presence of baseband analyzer 442 on bus 25 is already known to computer 12 as a consequence of the initial polling in populating Equipment Shelf 40. The graphical coupling of port 4421 of analyzer into circuit 54 is detected by computer 12 and converted into a set of switch instructions that accomplish the corresponding physical coupling of the actual test element in the same manner as has been already described.

The inclusion or removal of various test elements may be accomplished dynamically, that is, without terminating or interrupting the tests or disassembling the existing test setup or interrupting operation of the DUT. This is especially convenient when doing diagnostic tests because it allows the user to insert and remove various test elements as the test sequence proceeds without any need to rewire the test equipment or disconnect or shut off the device being tested. Similarly, there is no need to interrupt the test to manually load a new testing program or equipment driver (although that is not precluded) since the computer automatically recognizes any added test elements and retrieves from memory the operating, range and other data or instructions needed for the added test element. Computer 12 also, desirably, causes the added test element to automatically power-ON when added to the Test Bench and/or coupled into the test circuit.

If a desired test element is initially unavailable to bus 25, it is inserted into an empty one of plugs 29 whereupon it is recognized by computer 12 and added to the test elements available on Equipment Shelf window 40, from whence the user may select it and couple it into circuit 54. Similarly, equipment which is no longer needed in circuit 54, may be removed and returned to Equipment Shelf window 42 by means of graphically issued commands, e.g., by deleting the connection lines to the relevant I/O ports and dragging the icons back to window 40. This causes the corresponding switches 28 to be reset under control of computer 12 to power-OFF and disconnect the corresponding physical test elements 26 from circuit 54.

As noted above, further feature of the present invention is automatic control of the power-ON/OFF status of the test elements to minimize power dissipation within the test set. In the preferred embodiment, test elements 26 remain in the power-OFF state while their corresponding icons are on Equipment Shelf window 40 and are switched to the power-ON state when their icons are moved to Test Bench window 42 or when coupled into test circuit 54, either arrangement being satisfactory. Conversely, when removed from circuit 54 or removed from Test Bench window 42, those icons return to the power-OFF state. This minimizes test set power dissipation. This is readily accomplished, for example, by setting a flag in the data record associated with the icon, the flag having a first logical value corresponding to "power-OFF" when the icon is on the Equipment Shelf window (or out of circuit 54) and having a second logical value associated with "power-ON" status when the icon is on the Test Bench window (or in circuit 54). The flag is polled by computer 12 and a signal sent along bus 25 to the switches associated with the test element represented by the icon, commanding the switches to disconnect or connect the power leads to the test element in correspondence with the logical value of the flag. While this manner of accomplishing the power-ON/OFF settings is convenient, other means of automatically accomplishing the same result may also be used. While automatic power-ON/OFF switching based on the location of the corresponding icons or their insertion or removal from the graphical test circuit is desirable, it is not essential.

Returning to the discussion of FIG. 7, if the response to query 96 is "Yes", then a second query step 100 desirably occurs to determine whether the user wishes to store the test configuration and settings. If the answer is "Yes", then step 102 occurs in which the Test Bench window elements' selection, interconnections, I/O signals and ranges and other information are stored in memory 18 (or elsewhere) after which test device routine 80 ends at 104.

Block 106 provides an alternate means of executing test process 80. Rather than proceeding through steps 50, 60, 86 and 88, a predetermined test configuration which may have been earlier stored via step 102 is recalled in step 106 and displayed on Test Bench window 42. Then, "run test" step 90 may be executed according to such predetermined test configuration. Such predetermined test configuration may be selected initially as indicated by line 105 or in connection with step 98 as indicated by line 107. Output 109 of recall step 106 is then fed to "run test" step 90 as indicated by line 109 or, as indicated by the dashed lines, to any intermediate stage of process 80 so that the predefined test configuration may be modified. The user may select among the several possible alternatives, for example, by means of graphically presented options on display 16 and the use of pointing device 22.

Figure 8:
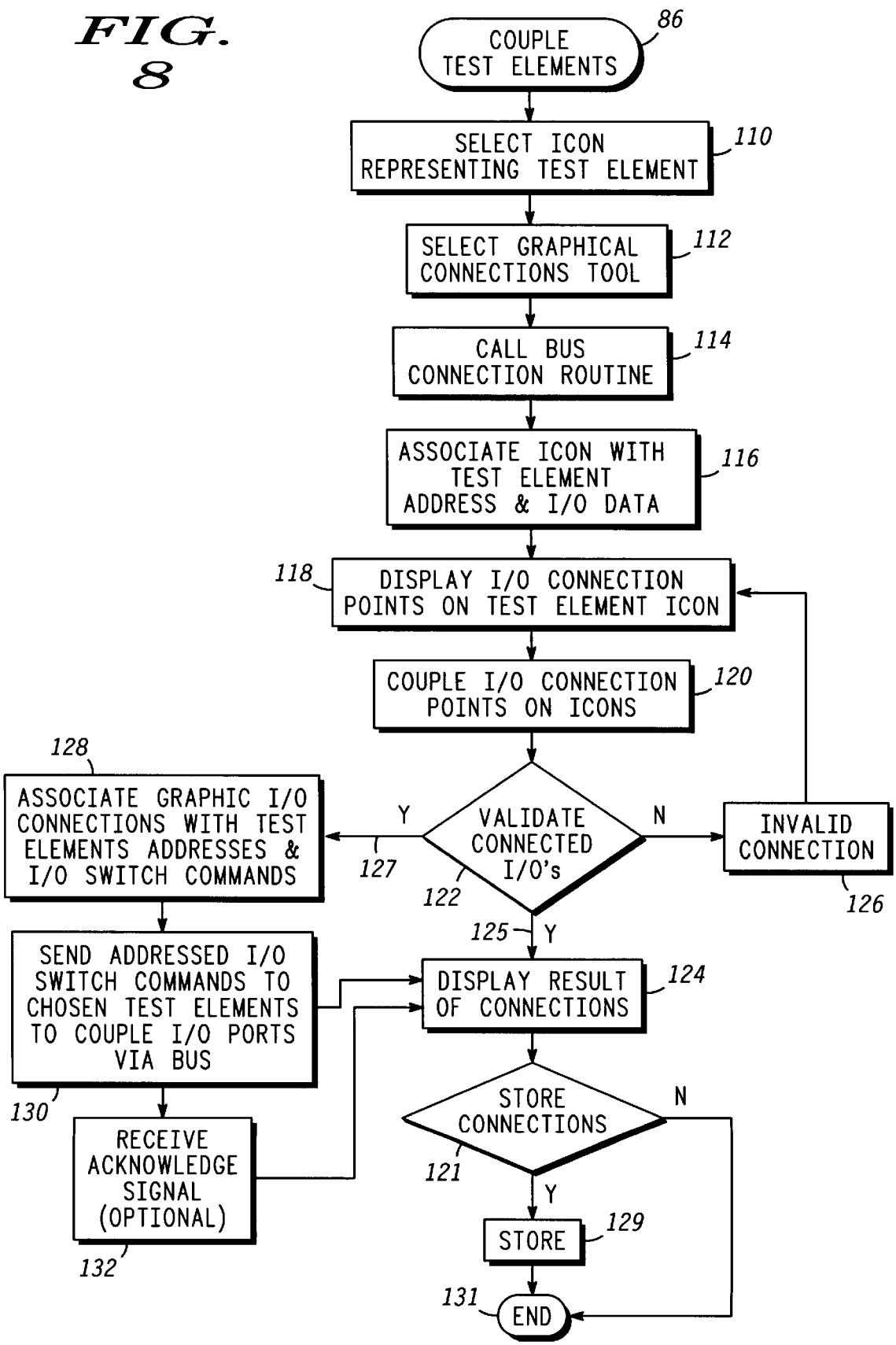
FIG. 8 is a simplified flow chart illustrating further details of the present invention related to the coupling of test elements.

FIG. 8 shows a simplified flow chart illustrating "couple test elements" process 86 in greater detail. "Couple test elements" process 86 comprises step 110 in which an icon representing a test element is selected, step 112 in which a graphical connection tool is selected, step 114 in which the bus connection information or sub-routine associated with the selected test elements is recalled, and step 116 in which the graphical icon is associated with, at least, the test element address and input-output reference data. While steps 110, 112, 114, and 116 are illustrated as being executed in sequential order, this is merely for convenience of explanation and is not essential, and they may be performed in various other orders. A non-limiting example is to perform step 112 prior to step 110.

In step 118, the I/O connection point symbols on the test elements icons are presented in the display. As noted in the examples in FIGS. 2, 3, and 4, these may be present at all times with the icon as a part of its graphical construct. In any case, step 118 may be performed at any time prior to step 120 in which the operator graphically couples the I/O connection point symbols on icons 44' to arrange them into circuit 54 presented graphically on Test Bench window 42.

When a graphical connection has been attempted or made between the desired I/O port symbols, validation query step 122 is desirably executed to determine whether or not connection of these I/O ports is permitted. This may be done automatically as each connection is attempted or it may be done discretely after several preliminary connections have been made in response to a screen query (e.g., Validate? Yes/No?). In the preferred embodiment, those connections which are not allowable would not remain on the screen.

The desirability of validation step 122 is better understood by considering that it is wasteful of time and resources to allow arbitrary connection of the various test element I/O ports, where the signals being exchanged are incompatible. For example, digital signal inputs cannot usefully be connected in real world instruments to analog inputs and vice versa. Similarly, it makes no sense to connect an audio signal port to an RF port and vice versa or connect input and output of the same device with no other connection.

There is conveniently stored in memory 18 for each available test element 26, a table or other representation of I/O ports of other test elements to which the I/O ports of a selected test element may be connected. If the connection attempted in step 120 is of a permitted type, then the answer to validation query step 122 is "Yes" and the connection is allowed to be displayed as indicated in step 124 and if the answer is "No", then the "invalid connection" indication is actuated in step 126 and control desirably returns to step 118. An audible indication of a failed or successful connection may also be provided. The output of query step 122 may be to step 128 via path 127 or directly to display step 124 via path 125.

In step 128, the graphical connections created in step 120 and validated in step 122 are associated with, at least, the test element addresses and the stored I/O switch commands necessary to physically connect the test elements selected on Test Bench window 42 in the manner described by the graphical connections (e.g. circuit 54) made in steps 120, 122. As has been previously explained, for each icon and its I/O port symbols, there is an associated test element data file describing the physical I/O connections which may be made to that test element's I/O ports and describing the bus commands needed to accomplish such connections and to power-ON and power-OFF the test element.

When the graphical connection tool selected in step 112 makes a successful graphical connection between I/O port symbols, then in step 128 the corresponding physical I/O connections to the selected test elements are identified and, from memory 18, the commands are identified which must be transmitted on bus 25 to switches 28 to accomplish the connection described in graphical format by the user in step 120. Thus, on completion of step 128, computer 12 knows which I/O ports on which test elements are desired to be coupled to which other I/O ports on which other test elements present on Test Bench window 42, and has retrieved the corresponding switch control commands from memory necessary to create physical connections via bus 25 corresponding to the graphical connections.

In step 130, processor 14, sends the I/O switch commands and associated test elements addresses on bus 25 so as to cause the selected ones of switches 28 to open and close to produce real physical connections between the test elements 26 (and to elements 30, 32) which correspond to those portrayed graphically in circuit 54 on Test Bench window 42. In optional step 132, processor 14 receives an acknowledgment signal from test element 26 and/or its associated switch 28, that the coupling command was received and executed. Display step 124 may be executed immediately after validation or after step 130 or after step 132, or it may be modified after steps 130, 132 to indicate that (in step 130) the commands were sent and/or that (in step 132) the results were acknowledged.

Query step 121 is then executed wherein if the answer is "No" the routine ends at 131 and if the answer is "Yes" intermediate store step 129 is executed. The information stored in step 129 may be recalled at a subsequent time in order to recreate the stored test configuration without repeating the various selecting and connecting steps. At the completion of "couple test elements" routine 86, physical test set 10 has a sub-set of available test elements 261–26N, DUT interface 30 and DUT 32 as shown in graphically displayed circuit 54 of selected icons 44' on Test Bench window 42.

Figure 9:
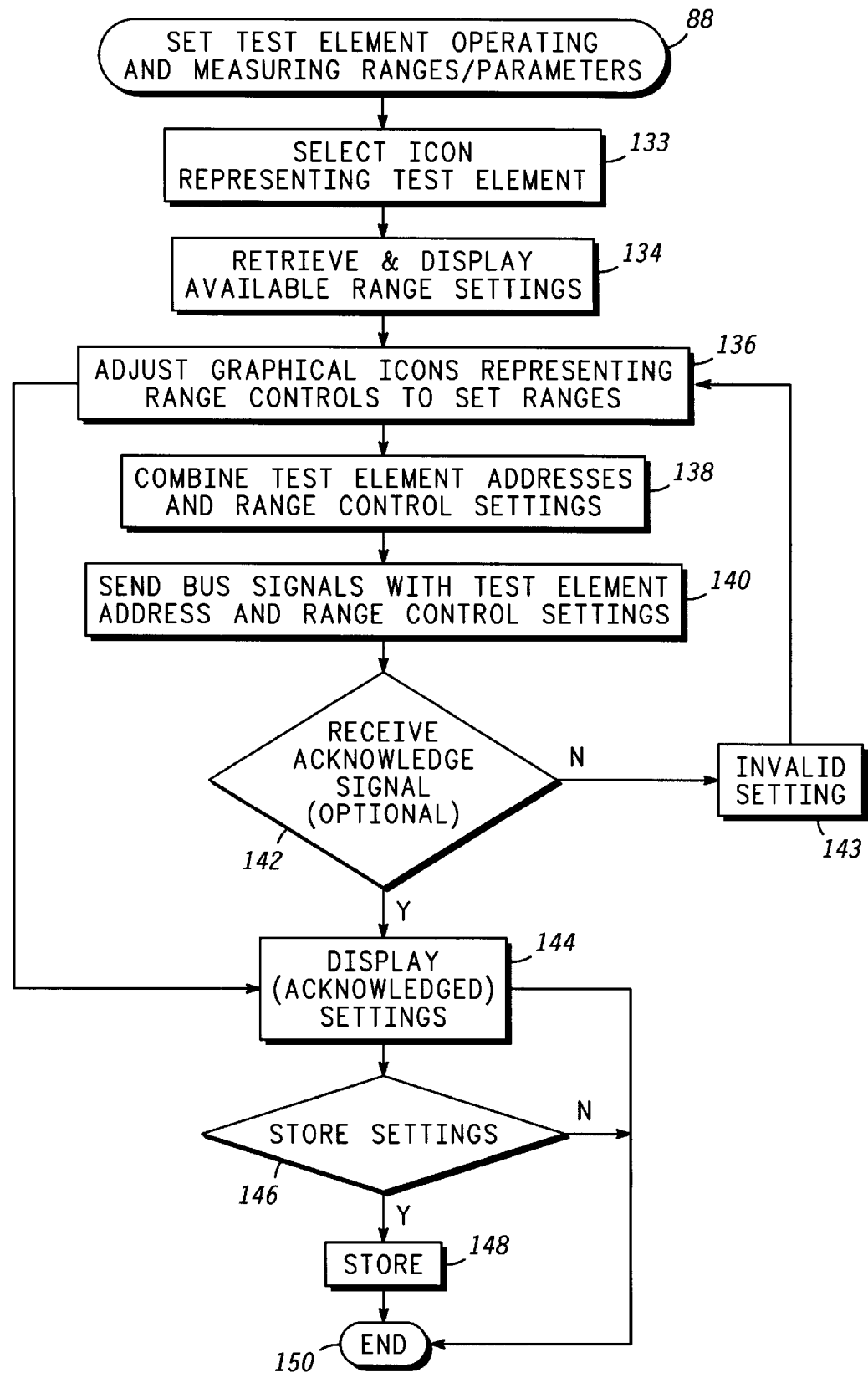
FIG. 9 is a simplified flow chart illustrating further details of the present invention related to setting test element operating and measuring ranges or parameters.

FIG. 9 is a simplified flow chart illustrating the performance of step 88 for setting the test element operating and measuring ranges and parameters. Step 133 is executed wherein the icon representing a desired test element is selected. Processor 14 then retrieves from memory 18 and displays on display 16 (e.g., step 134) the available range and parameter settings associated with the selected icon, preferably in enlarged form. In step 136, the user graphically adjusts those portions of the icon which represent the range and parameter controls to set the desired operating ranges and parameters (see, for example, enlarged oscilloscope display 441E shown in FIG. 4 and its associated range selection and parameter controls). Based on the description herein, those of skill in the art will understand how various sliders, pull down menus and other fields may be provided in graphical images to control computer and test element operation.

In step 138, at least the test element addresses and the range control settings created in step 136 are combined and in step 140, signals are sent along bus 25 containing the test element addresses and the range control settings necessary to set the parameters and ranges of operation of the test elements being addressed. Optional query step 142 is provided to determine whether the selected test element received the instructions sent. If the answer is "No", then step 143 "Invalid Setting" is invoked and control returns to step 136. If the answer is "Yes", then in step 144, the settings are displayed. Step 144 may be executed directly after step 136 or after receiving acknowledgment query 142. In query 146, it is determined whether the settings are desired to be stored. If the answer is "Yes", then store step 148 is executed otherwise end 150 occurs directly after step 144 or a "No" answer to query step 146. On completion of routine 88, test system 10 has desired test elements represented by sub-set of icons 44' (including the DUT interface and DUT) interconnected in the manner shown in graphical circuit 54 on the Test Bench window 42 and the appropriate test parameter and operating ranges set and it is physically ready to run the desired test.

It will be appreciated based on the foregoing description that the present invention provides an improved means and method for testing radios and other electronic equipment, where selection, interconnection and programming of the various test elements are accomplished using a GUI. Further, a wide variety of test functions and tests can be accommodated by means of pluggable modules interconnected by a computer controlled switching system. Data stored in memory allows the GUI icons to represent the test elements and to include I/O port symbols corresponding to the I/O ports of the test elements. Test results are conveniently (but not essentially) displayed in enlarged versions of the test element icons having, for example, the appearance of real test instruments with their associated controls and outputs represented in graphical form. The system is especially flexible and able to handle very complex radios, radio systems and other equipment in a compact and highly versatile test set. Because the test elements are modular and detachable from the test set, they may be easily changed. In this way, as new radios or other equipments are developed which require new test elements, they may be included in the test set by connecting them to one of the available plug-in connectors 29.

Those of skill in the art will appreciate based on the description herein that many variations may be made upon the concepts, structures and method, disclosed herein without departing from the present invention. Accordingly, it is intended to include such variations as will occur to those of skill in the art based on this invention disclosure, in the claims that follow.

We claim:

1. A method of operating a test set for testing a device, wherein the test set has a computer, and a graphical display and a switchable interconnection network controlled by the computer, the method comprising:

coupling multiple testing elements to the network;

operating the computer to interrogate the network to determine what testing elements are coupled to the network and to present on the graphical display, graphical symbols representing the multiple testing elements;

on the graphical display, selecting a set of the graphical symbols and interconnecting by the computer the graphical symbols to form a graphically defined test circuit; and energizing by the computer switches and portions of the network to electrically interconnect a set of the multiple testing elements corresponding to the set of the graphical symbols to form an interconnected physical test circuit corresponding to the graphically defined test circuit.

2. The method of claim 1, further comprising prior to the energizing step, verifying that the graphically defined test circuit corresponds to an allowed set of interconnections among the set of testing elements.

3. The method of claim 2 wherein the step of verifying comprises determining I/O ports on the set of testing elements desired to be connected and for a first I/O port desired to be connected to a second I/O port, retrieving from a memory an allowed list of I/O ports to which the first I/O port is permitted to be connected and determining whether the second I/O port is on the allowed list.

4. The method of claim 3 further comprising providing an error indication if the second I/O port is not on the allowed list.

5. The method of claim 2 further comprising performing the verifying step prior to allowing an attempted graphical connection of I/O ports on the graphical symbols to be completed on the graphical display.

6. A method for configuring a test system using a graphical user interface (GUI), the test system having multiple test elements, an interconnecting circuit for coupling the multiple test elements through computer controlled switches and a computer for controlling the switches and operating at least some of the multiple test elements via the interconnecting circuit in response to GUI inputs, the computer including a graphic display and memory, wherein the method comprises:

providing on the graphic display, a representation of the multiple test elements available to the interconnecting circuit, wherein each such test element is represented by a graphic icon having input-output (I/O) port symbols representing those I/O ports available on such test element, and wherein such graphic icon has associated therewith a stored data table comprising at least an address of such test element and control codes for coupling I/O ports of such test element to selected lines of the interconnecting circuit;

on the graphic display, selecting a set of graphic icons corresponding to a set of test elements which are desired to be used to perform a test to be carried out by the test system and graphically coupling I/O port symbols of at least two of the set of graphic icons;

retrieving from the stored data table, the control codes and interconnecting circuit addresses corresponding to the graphically coupled I/O port symbols;

switching through the computer controlled switches the set of multiple test elements which are desirable to be used to perform the test to be carried out; and sending by the computer to the set of multiple test elements, one or more messages via the interconnecting circuit, the one or more messages comprising the control codes and addresses retrieved from the stored data table, to cause switches associated with the I/O ports to open or close so as to provide via the interconnecting circuit, physical signal interconnecting between the I/O ports of the set of multiple test elements that corresponds to the graphical coupling of the I/O port symbols on the graphic display.

7. The method of claim 6, wherein the stored data table further comprises information on settable parameters and ranges associated with the multiple test elements and the graphic icon representing a test element has user adjustable inputs corresponding to the settable parameters and ranges, and wherein the method further comprises:

adjusting the user adjustable inputs on at least one graphic icon to provide a desired test condition;

retrieving from the stored data table for the at least one graphic icon, further control codes for adjusting the settable parameters and ranges of operation of the test element corresponding to the at least one graphic icon; and sending the further control codes to the test element represented by the at least one graphic icon to adjust the settable parameters and ranges of the test element represented by the graphic icon to correspond to settings of the user adjustable inputs on the at least one graphic icon.

8. The method of claim 6 wherein the providing step comprises electronically interrogating the multiple test elements coupled to the interconnecting circuit to determine addresses and types of test elements coupled to the interconnecting circuit and available to be utilized in performing a test, and retrieving from the memory a graphic icon and data table corresponding to each of the multiple test elements.

9. The method of claim 8 wherein some of the multiple test elements contain further memory in which is stored an index identifying said some of the multiple test elements to the computer.

10. The method of claim 8 wherein at least one of the multiple test elements contain further memory in which is stored information relating thereto, the method further comprises the step of reading the further memory to place such information in the stored data table associated with the graphic icon corresponding to the at least one of the multiple test elements.

11. The method of claim 6 wherein the selecting step comprises, leaving non-selected test element icons visible on the graphic display in a manner that identifies them as being non-selected.

12. The method of claim 6 wherein the step of graphically coupling the I/O port symbols comprises, performing an attempted graphical coupling of the I/O port symbols, validating the attempted graphical coupling of the I/O port symbols by determining from one or more stored data tables whether physical I/O ports are allowed to be coupled as indicated by the attempted graphical coupling of the I/O port symbols, and allowing the attempted graphical coupling of I/O port symbols if validation is successful.

13. The method of claim 12 wherein, if validation is not successful, rejecting the attempted graphical coupling of the I/O port symbols and giving an error indication.

14. The method of claim 6 further comprising after the selecting step, sending one or more messages along the interconnecting circuit addressed to test elements corresponding to the selected set of graphic icons, thereby causing them to power-ON.

15. The method of claim 14 further comprising after the selecting step, modifying the selected set of graphic icon representing test elements that have been caused to power-ON to indicate that power-ON has occurred.

16. The method of claim 14 further comprising, sending one or more messages along the interconnecting circuit so that those elements which are not graphically coupled are in a power-OFF state.

17. The method of claim 6 wherein the selecting step comprises moving desired icons from a first display window showing icons of available test elements to a second display window wherein icons of selected test elements may be interconnected to graphically form a test circuit.

18. A test system configurable by a graphical user interface (GUI), comprising:
   a plurality of physical testing elements having physical input-output (I/O) ports;
   a computer having a memory, at least one I/O device, and a display exhibiting a GUI;
   a switching network having a plurality of nodes of one or more lines, said nodes for selectively coupling to the plurality of physical testing elements, and a further node of one or more lines for coupling to a device under test (DUT), each node having a unique address, wherein the switching network communicates with and is controlled by the computer so as to couple a desired set of the physical testing elements and the DUT in a manner determined by a graphical circuit configuration prepared on the GUI;
   wherein the computer interrogates the nodes of the switching network to identify the physical testing elements coupled thereto and shows on the display graphical testing elements symbols including graphical I/O port symbols corresponding to the physical I/O ports of the physical testing elements; and
   wherein control programs operate the computer to: (i) allow a user to graphically choose a set of the graphical testing elements symbols corresponding to a set of physical testing elements desired for testing the DUT, (ii) allow a user to graphically couple graphical I/O port symbols to form the graphical circuit configuration on the display, and (iii) retrieve from memory and send to the switching network to interconnect the physical I/O ports of the set of multiple physical testing elements and the DUT in a physical circuit configuration equivalent to the graphical circuit configuration.

19. The system of claim 18 wherein the control programs operate the computer to compare the graphical I/O port symbols attempted to be coupled by the user to an allowed list of I/O ports that may be coupled, and if the graphical I/O port symbols attempted to be coupled by the user are not found on the allowed list of I/O ports that may be coupled, providing a visual or audible error indication or both.

20. The system of claim 18 wherein the graphical I/O port symbols visually distinguish between ports of RF signals and ports for other signals.

21. The system of claim 18 wherein the graphical I/O port symbols visually distinguish between ports for RF signals, ports for lower frequency analog signals and ports for digital signals.

22. The system of claim 18, wherein the set of physical testing elements are in a power-ON state and other testing elements not included in the set of physical testing elements are in power-OFF state.

23. A method of operating a test set for testing a device, wherein the test set has a computer, and a graphical display and a switchable interconnection network controlled by the computer, the method comprising:
   selectively coupling multiple testing elements to the network;
   operating the computer to interrogate the network to determine what testing elements are coupled to the network and to present on the graphical display, graphical symbols representing the testing elements;
   on the graphical display, selecting a first sub-set of the graphical symbols and coupling them to form a first graphically defined test circuit;
   energizing switches and portions of the network to interconnect the first sub-set of testing elements to form a first physical test circuit for testing the device, the first physical test circuit corresponding to the first graphically defined test circuit;
   repeating the steps of selecting, coupling and energizing with a second sub-set of graphical symbols to form a second physical test circuit different from the first physical test circuit without interrupting operation of the device and without terminating a test being carried out by the first physical test circuit; and
   the repeating step is performed without interrupting a test being carried out by the first physical test circuit.

24. The method of claim 23 further comprising prior to the repeating step, adding or removing testing elements to the network and operating the computer to interrogate the network to determine what testing elements have been added or removed from the network and to present on the graphical display, graphical symbols representing added testing elements and delete graphical symbols representing removed testing elements.

25. A test system configurable by a graphical user interface (GUI), comprising:
   a plurality of physical testing elements having physical input-output (I/O) ports;
   a computer having a memory, at least one I/O device, and a display exhibiting a GUI;
   a switching network having a plurality of nodes of one or more lines, said nodes for selectively coupling to the plurality of physical testing elements, and a further node of one or more lines for coupling to a device under test (DUT), each node having a unique address, wherein the switching network communicates with and is controlled by the computer so as to couple a desired set of the physical testing elements and the DUT in a manner determined by a graphical circuit configuration prepared on the GUI;

wherein the computer interrogates the nodes of the switching network to identify the physical testing elements coupled thereto and shows on the display graphical testing elements symbols including graphical I/O port symbols corresponding to the physical I/O ports of the physical testing elements;

wherein control programs operate the computer to: (i) allow a user to graphically choose a set of the graphical testing elements symbols corresponding to a set of physical testing elements symbols corresponding to a set of physical testing elements desired for testing the DUT, (ii) allow a suer to graphically couple graphical I/O port symbols to form the graphical circuit configuration on the display, and (iii) retrieve from memory and send to the switching network, control codes and addresses causing the switching network to couple the physical I/O ports of the set of physical testing elements and the DUT in a physical circuit configuration equivalent to the graphical circuit configuration;

the control programs operate the computer to compare the graphical I/O port symbols attempted to be coupled by the user to an allowed list of I/O ports that may be coupled, and if the graphical I/O port symbols attempted to be coupled by the user are not found on the allowed list of I/O ports that may be coupled, providing a visual or audible error indication or both.

26. The system of claim 25, wherein the graphical I/O port symbols visually distinguish between ports for RF signals and ports for other signals.

27. The system of claim 25, wherein the graphical I/O port symbols visually distinguish between ports for RF signals, ports for lower frequency analog signals and ports for digital signals.

28. The system of claim 25, wherein the set of physical testing elements are in a power-ON state and other testing elements not included in the set of physical testing elements are in a power-OFF state.

* * * * *